US007173295B1

(12) United States Patent
Mar et al.

(10) Patent No.: US 7,173,295 B1
(45) Date of Patent: Feb. 6, 2007

(54) MULTI-LINE TRIGGERING AND INTERDIGITATED ELECTRODE STRUCTURE FOR PHOTOCONDUCTIVE SEMICONDUCTOR SWITCHES

(75) Inventors: Alan Mar, Albuquerque, NM (US); Fred J. Zutavern, Albuquerque, NM (US); Guillermo Loubriel, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 39 days.

(21) Appl. No.: 10/463,058

(22) Filed: Jun. 16, 2003

Related U.S. Application Data

(60) Provisional application No. 60/389,563, filed on Jun. 17, 2002.

(51) Int. Cl.
*H01L 27/148* (2006.01)
(52) U.S. Cl. ............... 257/233; 257/433; 257/436; 257/443; 257/448; 257/466
(58) Field of Classification Search ................ 257/233, 257/292, 431–466
See application file for complete search history.

(56) References Cited

U.S. PATENT DOCUMENTS

| | | | |
|---|---|---|---|
| 5,804,815 A | | 9/1998 | Loubriel et al. |
| 6,248,992 B1 | | 6/2001 | Baca et al. |
| 6,252,221 B1 | * | 6/2001 | Kaneko et al. ....... 250/214 LS |
| 6,282,217 B1 | * | 8/2001 | Takase ................... 372/35 |
| 6,567,195 B1 | * | 5/2003 | Ford et al. ............. 398/58 |
| 6,687,280 B1 | * | 2/2004 | Kajita .................... 372/96 |

OTHER PUBLICATIONS

Zutavern et al., "High Gain GaAs Photoconductive Semiconductor Switches (PCSS): Device Lifetime, High Current Testing, Optical Pulse Generators," *SPIE* vol. 2343 *Optically Activated Switching IV*, 146 (1994).
Zutavern et al., "A Compact, Repetitive Accelerator for Military and Industrial Applications," *SAND98-0898* (1998).
Zutavern et al., "Properties of High Gain GaAs Switches for Pulsed Power Applications," Proc. 11th IEEE Pulsed Power Conference, Baltimore, MD, Jun. 29, 1997.
Loubriel et al., "Photoconductive Semiconductor Switches," *IEEE Trans. Plasma Science* 25(2), 124 (1997).
Loubriel et al., "Longevity of Optically Activated, High Gain GaAs Photoconductive Semiconductor Switches," *IEEE Trans. Plasma Science* 26(5), 1393 (1998).
Mar et al., "Fireset Applications of Improved Longevity Optically Activated GaAs Photoconductive Semiconductor Switches," presented at 13th IEEE Int. Pulsed Power Conf., Las Vegas, NV, Jun. 17, 2001.
Mar et al., "Device Technology Investigation: Subsystems Packaging Study: Feasibility of PCSS—Based Pulser for Highly Portable Platforms," SAND2002-2059, Jul. 2002.

* cited by examiner

*Primary Examiner*—Wai-Sing Louie
(74) *Attorney, Agent, or Firm*—Kevin W. Bieg

(57) ABSTRACT

An improved photoconductive semiconductor switch comprises multiple-line optical triggering of multiple, high-current parallel filaments between the switch electrodes. The switch can also have a multi-gap, interdigitated electrode for the generation of additional parallel filaments. Multi-line triggering can increase the switch lifetime at high currents by increasing the number of current filaments and reducing the current density at the contact electrodes in a controlled manner. Furthermore, the improved switch can mitigate the degradation of switching conditions with increased number of firings of the switch.

14 Claims, 5 Drawing Sheets

MULTI-LINE TRIGGERING AND INTERDIGITATED ELECTRODE STRUCTURE FOR PHOTOCONDUCTIVE SEMICONDUCTOR SWITCHES

CROSS-REFERENCE TO RELATED APPLICATIONS

This application claims the benefit of Provisional Application No. 60/389,563, filed on Jun. 17, 2002.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

This invention relates to the field of switches and, more particularly, to a high-gain photoconductive semiconductor switch for repetitive switching of electronic devices.

BACKGROUND OF THE INVENTION

Photoconductive semiconductor switches (PCSS) can bemused for the switching of high-speed, high-power, high-voltage electronics and optoelectronics. These uses include pulsed power applications as diverse as low-impedance, high-current firing sets in munitions; high-impedance, low-current Pockels cell or Q-switch drivers for laser diode arrays; high-voltage, high-current compact accelerators; and pulsers for ground penetrating radar. PCSS have demonstrated significant improvement over conventional pulsed power switching technologies, including 100 ps rise time, kilohertz (continuous) and megahertz (burst) repetition rates, scalable or stackable to hundreds of kilovolts and tens of kiloamps, optical control and isolation, and inherent solid-state reliability. See Loubriel at al., "Photoconductive Semiconductor Switches," *IEEE Trans. Plasma Science* 25(2), 124 (1997), and U.S. Pat. No. 5,804,815 to Loubriel et al., which are incorporated herein by reference.

In particular, optically triggered PCSS can provide high-voltage isolation due to their being optically, rather than electrically, initiated. Furthermore, PCSS can be made radiation-hardened by reducing the carrier lifetime of semiconductor material in the switch gap, such as by neutron irradiation. PCSS are therefore useful in radiation environments and in environments that have electrical interference. For example, optically triggered PCSS can be made immune to lightning strikes that would accidentally trigger electrically activated devices.

With an optically triggered PCSS, the energy of the incident photons excites electrons from the valence band to the conduction band of the semiconductor. Conventional PCSS produce only one electron-hole pair per absorbed photon. In this linear-mode, the excitation is independent of the electric field across the switch. Therefore, the conventional PCSS can be operated to arbitrarily low voltage. For example, a GaAs PCSS operates in the linear mode at electric fields below about 4 kV/cm. However, this linear mode operation requires a high power laser to optically trigger the PCSS and achieve high current switching. Furthermore, after the exciting laser light is extinguished, the carrier density only slowly exponentially decays, in 1–10 ns.

At higher electric fields, these switches can behave very differently. At high electric fields, a light source can trigger photo-excited carriers which then can collectively impact ionize additional carriers, resulting in avalanche carrier generation. Thus, one photon can produce many current carriers in a high-gain PCSS. Because the high electric field induces carrier multiplication, the amount of light required to achieve high current switching is reduced by as much as five orders of magnitude compared to the linear mode PCSS. For example, a 100 kV GaAs PCSS can be triggered with less than one microjoule of optical energy. Thus, extremely low energy light pulses, such as are available with a small laser diode array, can be used for optical triggering.

Another aspect of high-gain PCSS is a voltage drop during conduction. Once triggering is initiated, the high-gain PCSS continues to generate carriers until the field across the switch drops to a "lock-on" field (about 4–6 kV/cm in GaAs). In the "on" state the field across the high-gain PCSS stabilizes to this constant lock-on field. The switch current is then circuit-limited, and the switch will conduct whatever current is necessary to maintain the constant lock-on voltage until the energy in the circuit is dissipated.

However, in high-gain PCSS, the current flows in filaments. During high-gain switching, the PCSS emits bandgap radiation due to carrier recombination, which can be detected optically with a near-infrared sensitive camera. When this radiation is imaged, filaments are observed, even if the triggering light is uniform. The filaments can have densities of several megamperes per centimeter squared and diameters of 15–300 μm.

The lifetime of the PCSS is determined by circuit parameters, trigger properties, switch properties, and, in particular, the ability of the contact electrodes to resist erosion due to current filamentation. The high current density in a filament causes localized heating and damage at the contact boundary where the current enters or exits the semiconductor in the gap region of the switch. Subsequently, metal contact erosion causes degradation of switching conditions and eventual failure of the switch function. Furthermore, switch lifetime drops dramatically as the current is increased. Therefore, existing high gain PCSS are limited to applications wherein the switch is to be used for a limited number of low-current pulses. What is needed is an improved PCSS with a longer lifetime (longevity) for applications requiring higher current and longer duration switched pulses.

The present invention provides multiple-line triggering and an interdigitated electrode structure for an improved PCSS. The invention increases the switch lifetime at high currents by controlling the formation and number of multiple simultaneously generated parallel filaments to share the current, reducing the peak current density and damage. Furthermore, the present invention can mitigate the degradation of switching conditions with increased number of firings of the switch.

SUMMARY OF THE INVENTION

The present invention is directed to a photoconductive semiconductor switch, comprising a semi-insulating semiconductor substrate; at least two electrodes, mounted with the substrate, wherein the at least two electrodes are separated by at least one gap; a light source, for generating a plurality of lines of light; and optics, for imaging the plurality of lines of light onto the at least one gap for triggering a plurality of substantially parallel filaments of electrical current flow across the at least one gap when an electrical field is applied to the at least one gap.

A multi-gap embodiment of the photoconductive semiconductor switch comprises a semi-insulating semiconductor substrate; a first electrode, mounted with the substrate, the first electrode comprising one or more first contact fingers; a second electrode, mounted with the substrate, the second electrode comprising one or more second contact fingers; and wherein the one or more first contact fingers of the first electrode alternate with the one or more second contact fingers of the second electrode to form an interdigitated electrode structure with a plurality of gaps formed between the first contact fingers and the second contact fingers.

The present invention is further directed to a method for triggering multiple parallel filaments in the photoconductive semiconductor switch comprising generating a plurality of substantially parallel lines of light using a light source; imaging the plurality of substantially parallel lines of light onto the at least one gap using optics; and triggering a plurality of substantially parallel filaments across the at least one gap with the plurality of substantially parallel lines of light when an electrical field is applied to the at least one gap.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 3A is a photograph of current filaments resulting from the multi-line triggering with eight lines of light. FIG. 3B shows graphs of the degradation of the peak switch current for a multi-line triggered switch and a spot-triggered switch.

DETAILED DESCRIPTION OF THE INVENTION

Figure 1:
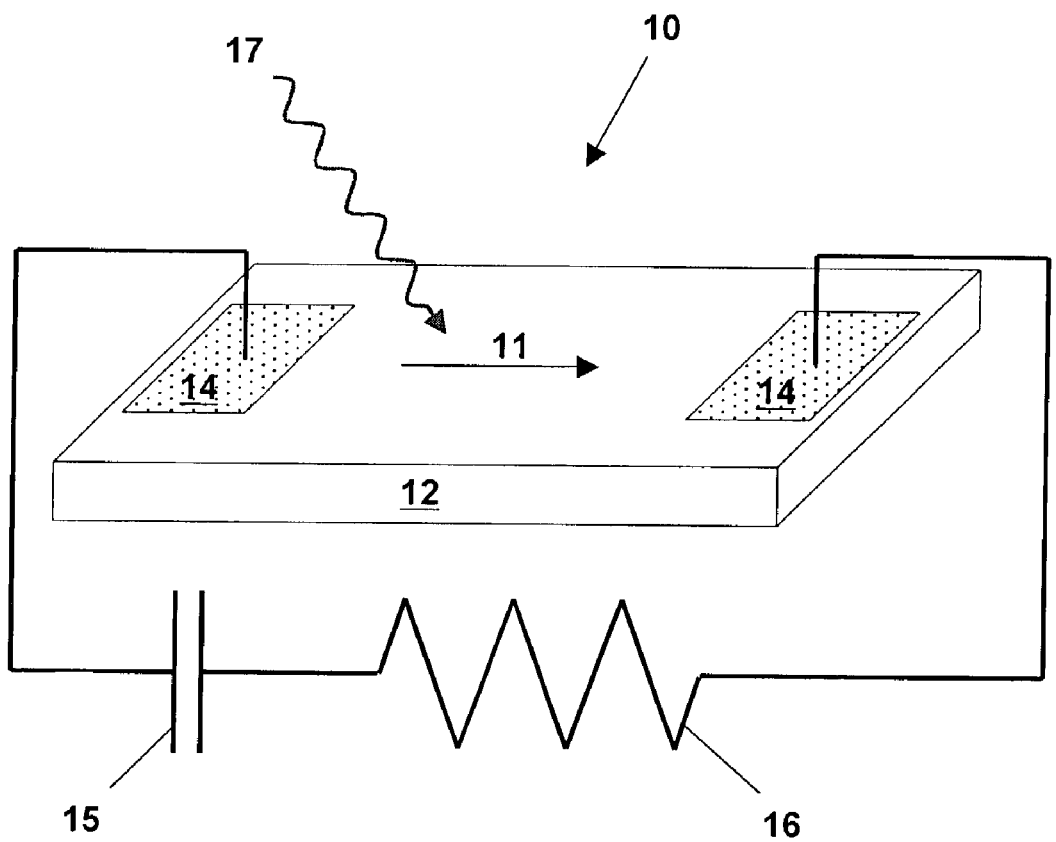
FIG. 1 is a schematic illustration of a high-gain PCCS in a lateral configuration.

In FIG. 1 is shown a schematic illustration of a PCSS in a lateral configuration. The lateral PCSS 10 comprises a semi-insulating (SI) semiconductor substrate 12 and electrical contacts 14 that connect the switch 10 to an energy source 15 and a load 16. For example, the switch can be used to discharge a capacitor 15 into a resistive load 16. With electrodes 14 on the opposite ends of the switch surface, the current 11 flows laterally across the gap, perpendicular to the electrodes 14. A high off resistance is preferable to keep the leakage current small, and increasing safety. Therefore, the semi-insulating semiconductor 12 can be a high resistivity semiconductor that exhibits high-gain carrier multiplication when optically initiated at a voltage stress above a lock-on field. The high resistivity semiconductor can be an undoped or compensated direct-bandgap semiconductor. Preferably, the semiconductor 12 can be undoped, SI GaAs with a resistivity of greater than $10^7$ ohm-cm. The contact electrodes 14 can be n-type or p-type. For a forward-biased p-i-n or a reverse-biased n-i-n switch, the contact electrode 14 are typically metallic lands. For example, the n-contact can be Ni—Ge—Au—Ni—Au and the p-contact can be Au—Be. To prevent dark breakdown of the gap (e.g., surface flashover at a breakdown field of greater than about 30 kV/cm in air), the electrodes 14 are typically separated by a gap length of less than one millimeter to several millimeters, depending on the switch voltage. The switch 10 can typically have a contact electrode width of several millimeters. In the lateral configuration, the switch 10 can be triggered by light 17 that illuminates the inter-electrode gap region. The light 17 can have a wavelength matched to the absorption band of the semiconductor 12 and provide sufficient illuminance to trigger avalanche carrier generation. Because of the high electric fields, the switch 10 is often immersed in a transparent dielectric liquid, such as a Fluorinert (not shown), to reduce the dark current and likelihood of surface flashover.

In prior PCSS, switch longitivity was found to be improved by reducing the density of carriers at the interface region between the semiconductor and metal contacts. This was achieved by reducing the filamentary current density in the lateral and/or vertical dimensions. Lateral current density reduction was achieved by triggering the switch with diffuse illumination of the gap near one of the contacts. Alternatively, laser light in round spots (such as from optical fibers) was used to spot-trigger filaments. Diffuse- or spot-triggering distributes the current more uniformly along the width of the contact by current-sharing amongst many filaments, thereby reducing damage near the contacts. See Zutavern et al., "High Gain GaAs Photoconductor Switches (PCSS): Device Lifetime, High Current Testing, Optical Pulse Generators," *SPIE Vol. 2343 Optically Activated Switching IV*, 146 (1994). Glass rods have also been used as cylindrical lenses to focus the light from multiple fibers into lines across the PCSS. However, this illumination method resulted in variations in intensity along the individual filaments and from filament-to-filament. See Zutavern et al., "Properties of High Gain GaAs Switches for Pulsed Power Applications," *Proc. 11th IEEE Pulsed Power Conf.*, Baltimore, Md., June, 1997. A vertical current density reduction was achieved by providing a local, highly doped semiconductor that cannot sustain the lock-on field near the contact. The highly doped region can be obtained by ion implantation, dopant diffusion, or epitaxial regrowth in the semiconductor directly underneath the contact in a region that extends into the gap. The highly doped region reduces the contact resistance and current pinching in the filament as it crosses the semiconductor to metal interface. Although these prior methods improved the switch longevity, prior diffuse-, spot-, or line-triggering methods do not adequately control filament formation and the doped contact structure does not adequately suppress filamentation at high current levels. See Loubriel et al., "Longevity of Optically Activated, High Gain GaAs Photoconductive Semiconductor Switches," *IEEE Trans. Plasma Science* 26(5), 1393 (1998) and U.S. Pat. No. 6,248,992 to Baca et al.

According to the present invention, a number of approaches can be used to alleviate the damage to high-gain PCSS while maintaining a high switched current and long pulse duration. Multi-line triggering by imaging of multiple lines of light onto the inter-electrode gap region can provide controlled, parallel filaments that share the current spatially along the lateral width of the contact. Furthermore, interdigitated multi-gap electrodes can be used to generate more filaments to further improve current distribution at the contacts and improve switch longevity.

Figure 2:
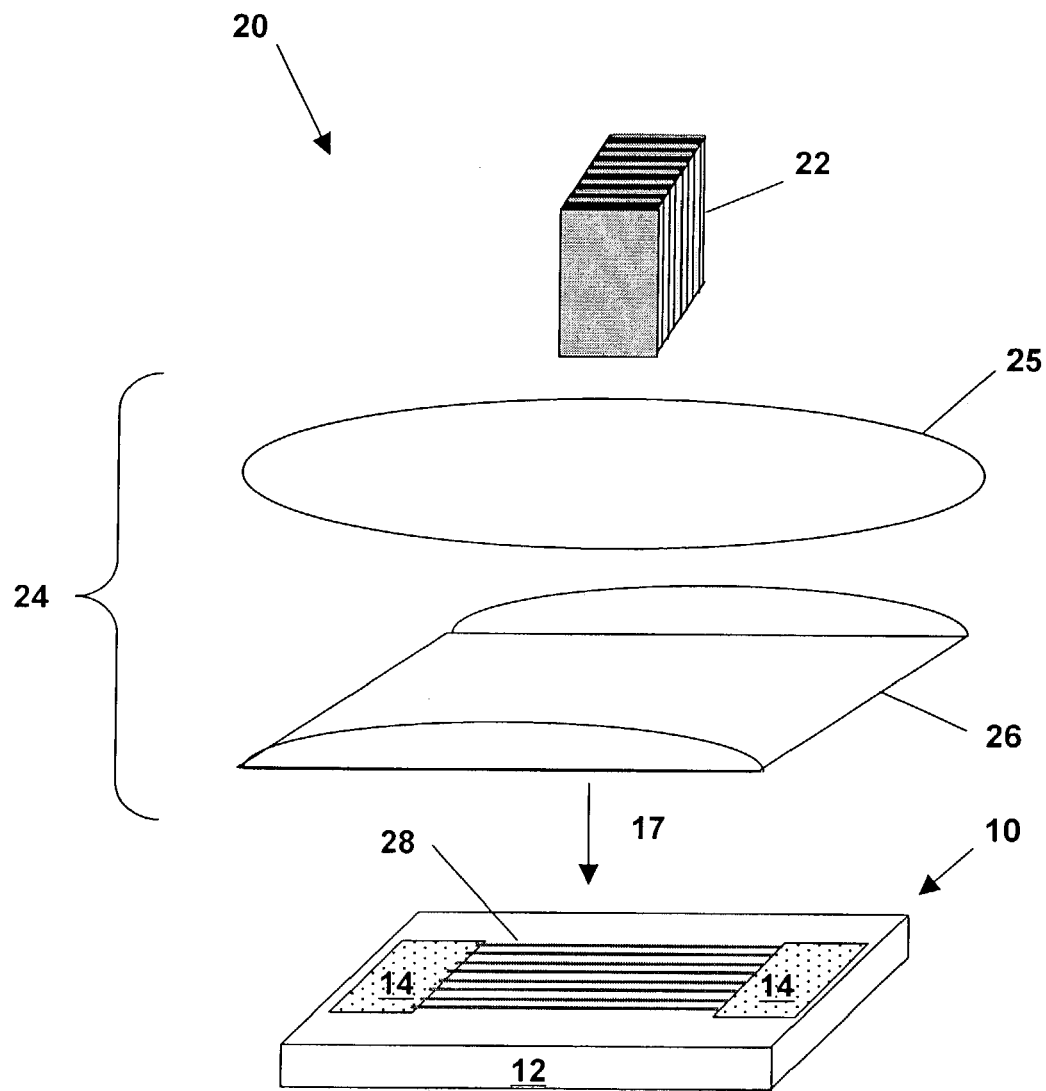
FIG. 2 is a schematic illustration of an exemplary illumination system for multi-line triggering of a lateral PCCS, comprising a laser diode array and anamorphic imaging optics.

In general, an illumination system can be used to provide trigger light having a wavelength matched to the absorption band of the semiconductor material and having a sufficient illuminance to produce avalanche carrier generation in multiple current-carrying filaments. In FIG. 2 is shown an embodiment of the present invention having an illumination system 20 comprising a light source 22 and optics 24 to provide a plurality of substantially parallel lines of trigger light across the gap of the switch 10. The light source 22 can generate multiple high-intensity lines of light simultaneously. The light source 22 is preferably a laser diode array comprising a stack of laser diode bars. The light is emitted in-plane from the edges of stacked bars of the laser diode array. Each stacked bar of the laser diode array generates a separate line-of-light. Small laser diode arrays are commercially available. For example, a suitable laser diode array is available from Laser Diode, Inc. (Model CVD-197F). The wavelength of this laser diode array is about 850 nm, which provides light energy greater than the bandgap of GaAs. This laser diode array delivers about 0.65 µJ of energy in a pulse duration of 13 ns. The laser diode array, electronics, power supply, and trigger generator can be obtained in a very small package (i.e., about 15 cubic in.).

Optics 24 can be used to image the line of light from each laser diode bar in a line focus on the inter-electrode region of the switch 10. Multiple current-carrying filaments can thereby be generated from the laser diode array to distribute the current more uniformly across the gap and reduce the peak current density at the contacts 14. In general, the optics 24 can comprise a lens, an optical waveguide (e.g. a fiber optic), curved mirrors, prisms, diffractive optics, or the like. Alternatively, a laser line source can be placed in close proximity to the surface of the semiconductor 12. Preferably, the optics 24 comprise a collimating lens 25 to collect and collimate the light from the light source 22 and an anamorphic optical element 26 (i.e., an optical element having a different power or magnification in one principal meridian than in the other) to shape and focus the collimated light to provide a plurality of high intensity lines of illumination that cross the surface of the switch gap. Preferably, the lines of light are substantially uniform along their length (i.e., the lines do not have dark spots) and from line-to-line.

As shown by the example in FIG. 2, the optics can comprise a aspherical collimating lens and a cylindrical lens to image lines of light from a diode laser array. This single-sided imaging geometry allows the control of the trigger illumination across the entire switch gap. The cylindrical lens can be used to shorten or to lengthen each laser line to fit the length of the gap between the contact electrodes. Thus, this anamorphic optical system can precisely set the magnification and aspect ratio of the imaged lines of light such that the laser lines exactly fill the length and width of the gap.

As shown in FIG. 2, with a single-gap, bipolar electrode structure, the line-focused trigger light 17 can be spatially spread out as multiple parallel lines of illumination 28 over a large area of the gap between the two electrode contacts 14. By the use multi-line triggering, more parallel filaments can share the current and the damage near the contacts is greatly lessened. Switching high currents then becomes a matter of generating more lines of light and filaments. Therefore, the longevity at high current can be improved by increasing the number or spacing between the laser trigger lines so that sufficient separation between the current filaments is maintained to minimize current crowding.

Figure 3A:
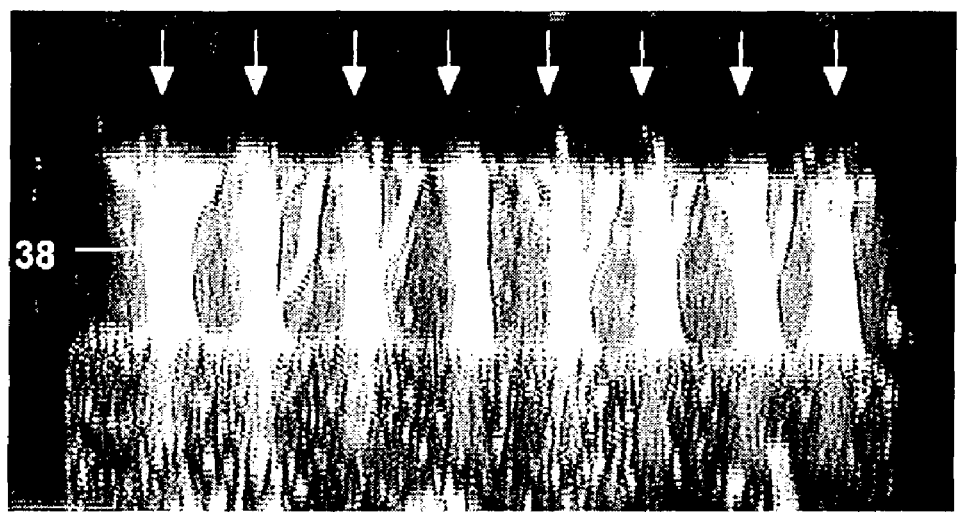
FIGS. 3A and 3B show the results of multi-line triggering of a high-gain, lateral PCCS.
Figure 3B:
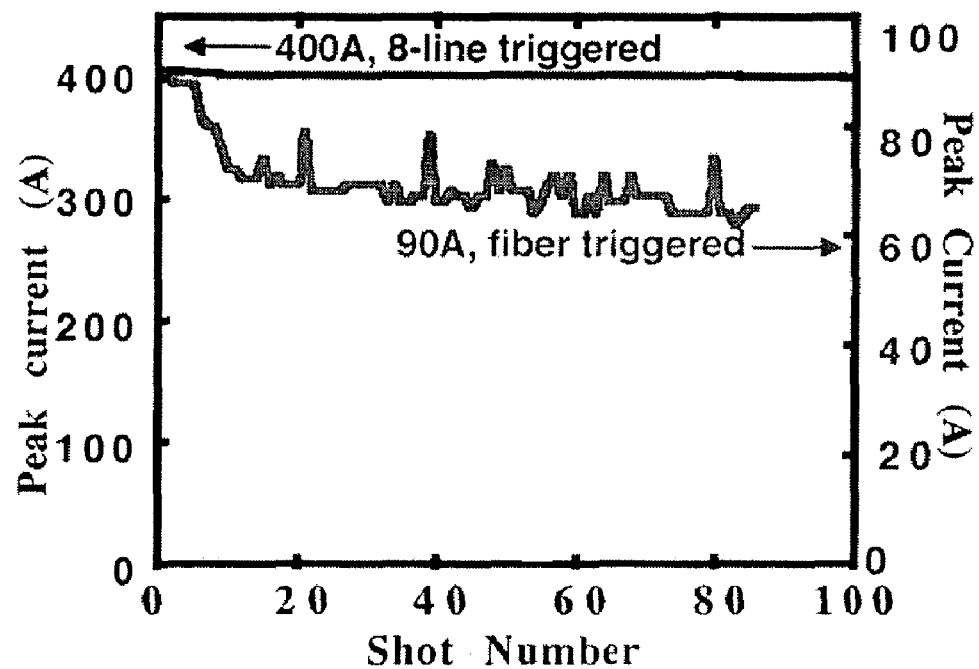

The multi-line triggering of the present invention was found to provide more consistent, straight parallel filaments than was previously achievable with diffuse- or spot-triggering. Shown in FIGS. 3A and 3B are the results of multi-line triggering comprising eight lines of light imaged onto the gap region of a lateral PCSS. As indicated by the photograph in FIG. 3A, eight parallel filaments 38 were formed uniformly along the width of the contacts. As shown in FIG. 3B, switching at nominally 400 A resulted in a current drop of only 2% after 100 shots with multi-line triggering. When spot-triggered, the same PCSS operating at only 90 A showed a 28% current drop after 86 shots, at which point complete switch failure occurred.

Other combinations of light sources, optics, and switch configurations can be used to generate the array of lines of illumination on the switch gap. Unfortunately, laser diode arrays may not be readily amenable to mass-production, requiring precise, painstaking stacking and soldering of the microscopic laser chips. In another embodiment, the invention can use vertical cavity surface emitting lasers (VCSELs) for imaging separate laser lines onto a switch gap. Multiple line-shaped VCSELs can be easily manufactured on the surface of a wafer. Therefore, virtually any number of line sources can be manufactured on a single device, eliminating the need for stacking of laser diodes in microscopic assemblies. Alternatively, light source can be a point source, or a single line source combined with an appropriate diffractive optic beam shaper as the optic designed to generate the multiple lines of illumination. Alternatively, the PCSS can have a vertical configuration, wherein the electrodes are on opposing surfaces of the SI semiconductor substrate or wafer and the filaments are formed through the bulk of the substrate. With a vertical PCSS, the ends of the substrate can be illuminated to form the current carrying filaments.

Figure 4:
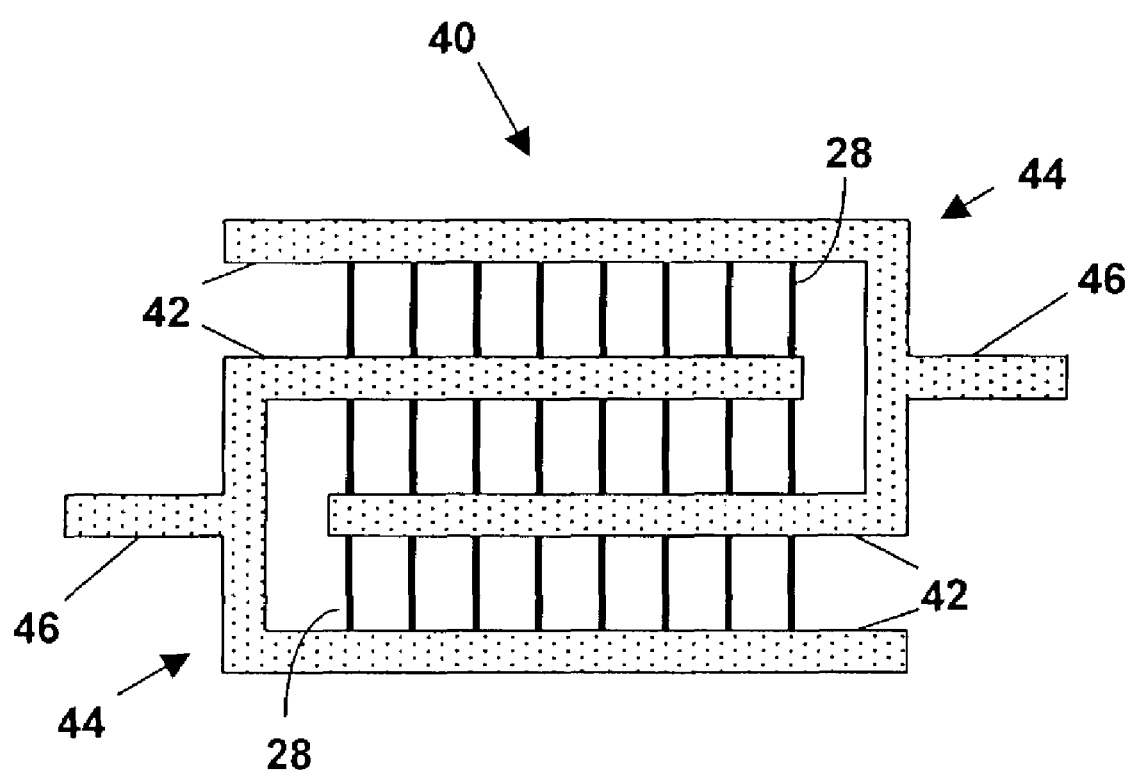
FIG. 4 shows an interdigitated electrode geometry for the PCSS.

In FIG. 4 is shown a top view of another embodiment of the present invention, comprising a multi-gap, interdigitated electrode structure 40 that can be used with multi-line triggering. The interdigitated electrode structure 40 enables the generation of additional parallel filaments without significantly increasing the complexity of the trigger light source or optics. The use of an interdigitated electrode structure 40 enables each line of light 28 to illuminate multiple gaps between the fingers 42 of two or more interdigitated electrodes 44. Therefore, the optics can be designed to lengthen the line focus and multiply the number of gaps covered by the illumination system. For example, a longer line of illumination from each stacked chip of a laser diode array can trigger multiple interdigitated gaps and generate multiple filaments for current carrying in the switch.

The exemplary interdigitated electrode structure 40 comprises two interdigitated electrodes 44 having four contact fingers 42 that form three switch gaps. With this configuration, each laser diode generates a parallel filament across each of the separate gaps. Electrical connections can be made to the interdigitated electrodes at the forked ends 46 (as shown) of each interdigitated electrodes 46 or at the fingers 45. Improved field uniformity and current distribution can be achieved by connecting the electrodes 44 at opposing forked ends 46 so that the switch current is carried equally in all of the filaments. As will be apparent to those skilled in the art, alternative interdigitated electrode structures can be used to provide alternative gap geometries and current flows.

Figure 5:
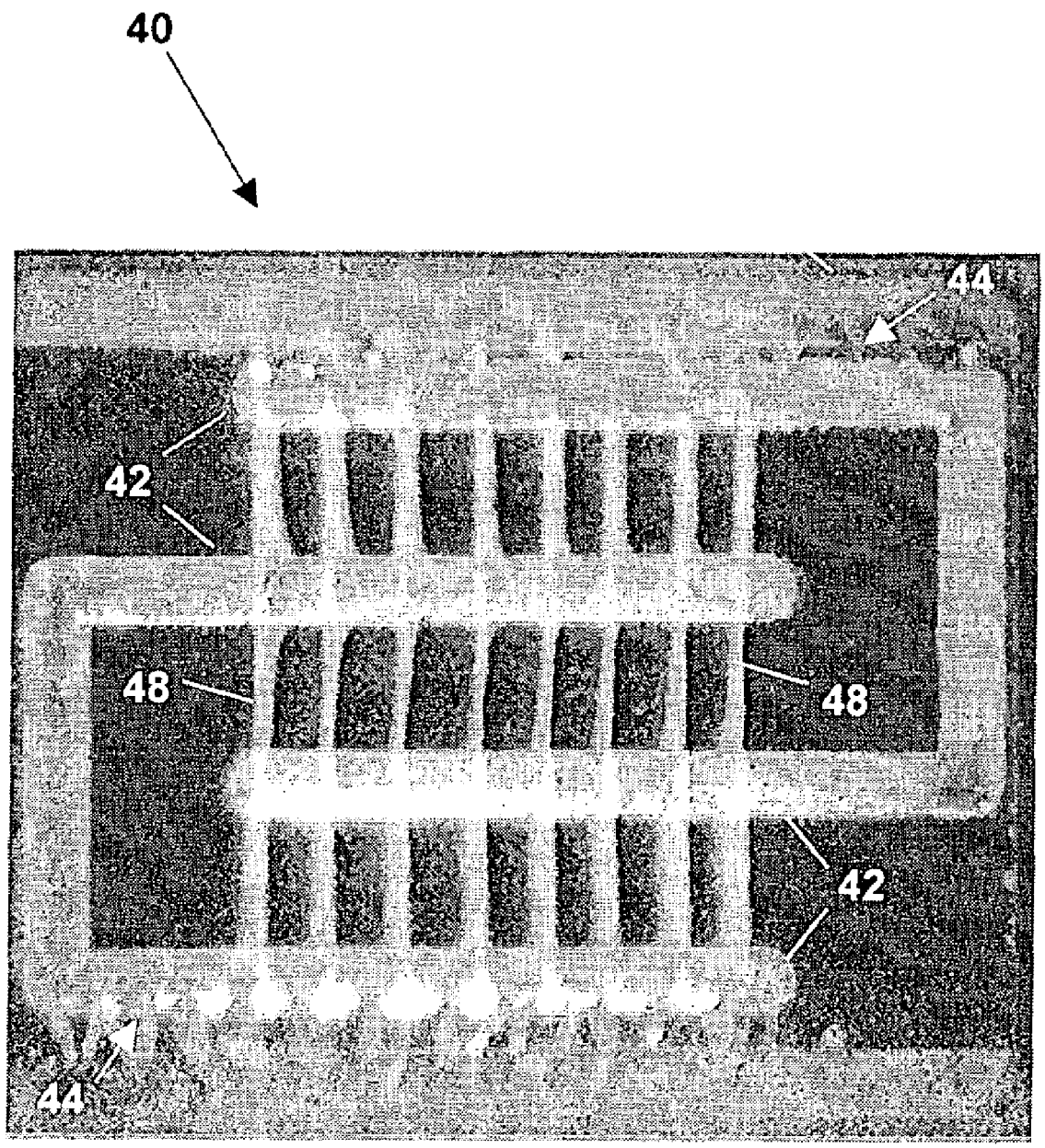
FIG. 5 is a photograph of current filaments resulting from multi-line triggering with eight lines of light of a PCSS with an interdigitated electrode geometry.

A GaAs PCSS comprising an interdigitated electrode structure was fabricated and tested for comparison to a PCSS with the single-gap electrode structure. Except for the difference in the electrode configurations, the circuit parameters, trigger properties, switch properties of the PCSSs were otherwise the same. In particular, the same eight-line triggering system described above in reference to FIGS. 3A and 3B was used to trigger the interdigitated PCSS. In FIG. 5 is shown a photograph of the filament formation in an interdigitated PCSS using two interdigitated electrodes 44. Twenty-four parallel filaments 48 were generated using eight laser trigger lines elongated to illuminate the three gaps. The interdigitated electrode structure combined with multi-line triggering results in greater distribution of current and thermal dissipation over the surface of the switch and contacts to improve lifetime. With the interdigitated electrode structure 40, current flow in the fingers 42 was perpendicular to the current flow in the filaments 48. At high current, the self-magnetic field associated with this perpendicular current flow in the fingers 42 caused deflection and spreading of the current flow as the filaments 48 entered the fingers 42. This spreading further reduced the current density at the fingers 42 and improves contact lifetime. The longevity of the interdigitated PCSS shown in FIG. 5 was 25 shots of 100 ns duration at a peak current 3 kA.

The present invention has been described as multi-line triggering and an interdigitated electrode structure for photoconductive semiconductor switches. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A photoconductive semiconductor switch, comprising:
a semi-insulating semiconductor substrate;
at least two electrodes, mounted with the substrate, wherein the at least two electrodes are separated by at least one gap;
a light source, for generating a plurality of substantially parallel lines of light; and
optics, for imaging the substantially parallel plurality of lines of light onto the inter-electrode region of the at least one gap for triggering a plurality of substantially parallel filaments of electrical current flow across the at least one gap when an electrical field is applied to the at least one gap.

2. The photoconductive semiconductor switch of claim 1, wherein the switch has a lateral geometry.

3. The photoconductive semiconductor switch of claim 1, wherein the switch has a vertical geometry.

4. The photoconductive semiconductor switch of claim 1, wherein the semi-insulating semiconductor substrate comprises high resistivity gallium arsenide.

5. The photoconductive semiconductor switch of claim 1, wherein the light source comprises a laser diode array comprising a stack of laser diode bars.

6. The photoconductive semiconductor switch of claim 5, wherein the diode laser array comprises at least two laser diode bars.

7. The photoconductive semiconductor switch of claim 1, wherein the light source comprises a vertical cavity surface-emitting laser.

8. The photoconductive semiconductor switch of claim 1, wherein the optics comprises:
a collimating lens to collect and collimate the plurality of substantially parallel lines of light from the light source; and
an anamorphic optical element for imaging the collimated lines of light onto the at least one gap.

9. The photoconductive semiconductor switch of claim 8, wherein the collimating lens comprises an aspherical collimating lens.

10. The photoconductive semiconductor switch of claim 8, wherein the anamorphic optical element comprises a cylindrical lens.

11. The photoconductive semiconductor switch of claim 1, wherein each of the at least two electrodes comprises one or more contact fingers, and wherein the at least two electrodes form an interdigitated electrode structure having a gap between each of the opposing interdigitated contact fingers.

12. The photoconductive semiconductor switch of claim 11, wherein each of the imaged lines of light triggers a plurality of filaments across more than gap.

13. The photoconductive semiconductor switch of claim 11, wherein each of the gaps has substantially equal length.

14. The photoconductive semiconductor switch of claim 11, further comprising connections to the at least two interdigitated electrodes whereby electrical current flows in the contact fingers substantially perpendicular to the electrical current flow in the plurality of filaments.

* * * * *